United States Patent
Kim et al.

(10) Patent No.: US 9,269,757 B2
(45) Date of Patent: Feb. 23, 2016

(54) ORGANIC LIGHT EMITTING DIODE DISPLAY DEVICE

(71) Applicant: LG DISPLAY CO., LTD., Seoul (KR)

(72) Inventors: Eui-Tae Kim, Paju-si (KR); Bu-Yeol Lee, Goyang-si (KR); Jae-Myon Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/536,219

(22) Filed: Nov. 7, 2014

(65) Prior Publication Data
US 2015/0187861 A1 Jul. 2, 2015

(30) Foreign Application Priority Data
Dec. 30, 2013 (KR) .......................... 10-2013-0167627

(51) Int. Cl.
*H01L 27/32* (2006.01)

(52) U.S. Cl.
CPC .......... *H01L 27/3276* (2013.01); *H01L 27/326* (2013.01); *H01L 27/3248* (2013.01); *H01L 27/3262* (2013.01); *H01L 27/3265* (2013.01); *H01L 27/323* (2013.01); *H01L 27/3234* (2013.01)

(58) Field of Classification Search
CPC ............ H01L 27/3265; H01L 27/3269; H01L 27/323; H01L 27/3227; H01L 27/3234; H01L 27/326; H01L 27/3276
See application file for complete search history.

(56) References Cited

U.S. PATENT DOCUMENTS

| | | | |
|---|---|---|---|
| 2002/0104995 A1 | 8/2002 | Yamazaki et al. | |
| 2010/0102301 A1* | 4/2010 | Yang et al. | 257/40 |
| 2011/0012816 A1* | 1/2011 | Kang et al. | 345/76 |
| 2011/0163664 A1 | 7/2011 | Kang et al. | |
| 2011/0221661 A1 | 9/2011 | Yoon et al. | |
| 2013/0328853 A1 | 12/2013 | Hong | |

* cited by examiner

*Primary Examiner* — Yu Chen
(74) *Attorney, Agent, or Firm* — Birch, Stewart, Kolasch & Birch, LLP

(57) ABSTRACT

An organic light emitting diode display device in accordance with various embodiments may include: a pixel region defined by a gate line and a data line and having an emitting area and a transparent area; at least one driving element disposed in the emitting area; a power line overlapping the emitting area and connected to the at least one driving element; a first capacitor electrode disposed in the emitting area and overlapping the power line, wherein the power line and the first capacitor electrode form a first storage capacitor; and a second capacitor electrode disposed in the emitting area and overlapping the first capacitor electrode, wherein the first capacitor electrode and the second capacitor electrode form a second storage capacitor.

18 Claims, 6 Drawing Sheets

ORGANIC LIGHT EMITTING DIODE DISPLAY DEVICE

CROSS-REFERENCE TO RELATED APPLICATIONS

The present application claims the benefit of priority of Korean Patent Application No. 10-2013-0167627 filed on Dec. 30, 2013, which is hereby incorporated by reference for all purposes as if fully set forth herein.

BACKGROUND OF THE INVENTION

1. Field of the Invention

The present disclosure relates to an organic light emitting diode display device. The present disclosure also relates to an active matrix organic light emitting diode display device and a method of fabricating the same.

2. Discussion of the Related Art

As the information society progresses, importance of a flat panel display (FPD) has increased. Although a liquid crystal display (LCD) device has been overwhelming in market share among various FPDs, an organic light emitting diode (OLED) display device is getting the spotlight as a next generation FPD due to a light weight, a thin profile and a low power consumption as compared with the LCD device having an additional light source, a color shift according to a viewing angle and a high power consumption. The OLED display device having excellent viewing angle and contrast ratio is easily applicable to a flexible substrate and has an emissive type where an additional light source is not necessary. As a result, the OLED display device is more easily applicable to a next generation FPD such as a flexible display and a transparent display as compared with the LCD device.

The transparent display requires a transmittance of about 35% to about 40% for users to watch an image of the OLED panel and a background behind the OLED panel. However, since an area for driving elements such as thin film transistors for driving a light emitting diode is relatively wide, the OLED display device has a limit in increasing the transmittance.

FIG. 1 is a plan view showing a transparent organic light emitting diode display device according to the related art, and FIG. 2 is a cross-sectional view taken along a line II-II of FIG. 1.

In FIGS. 1 and 2, a transparent organic light emitting diode (OLED) display device according to the related art includes a pixel region PX defined by a gate line GL, a data line DL and a power line VL. The pixel region PX includes an emitting area EA and a transparent area TA, and driving elements 130 are formed in the emitting area EA. The transparent area TA may be transparent or substantially transparent for visible light. The presence of the driving elements 130 in the emitting area EA may have the effect that the emitting area EA has a lower transmittance for visible light compared to the transparent area TA. For example, the emitting area EA may be substantially non-transparent for visible light. Among the driving elements in the emitting area EA, a storage capacitor has the largest area. The storage capacitor includes first and second capacitor electrodes 110 and 120 facing and spaced apart from each other. The capacitance of the storage capacitor is proportional to an area of the first and second capacitor electrodes 110 and 120 and is inversely proportional to a gap distance between the first and second capacitor electrodes 110 and 120. Accordingly, as the area of the first and second capacitor electrodes 110 and 120 increases and as the gap distance between the first and second capacitor electrodes 110 decreases, the capacitance of the storage capacitor increases.

The storage capacitor keeps the emission of the light emitting diode during a frame. As a result, a sufficient capacitance of the storage capacitor is required to keep the emission during a frame. However, when the area of the first and second capacitor electrodes 110 and 120 is enlarged for a sufficient capacitance, an area of the transparent area TA is reduced and it is difficult to obtain the transmittance of about 35% to about 40%.

In addition, since only a pair of storage electrodes 110 and 120 are formed, there is a limit to increase of the capacitance. In a bottom emission type OLED display device, when the first and second capacitor electrodes 110 and 120 are enlarged, the area for the driving elements increases and the area for the emitting area EA decreases, thereby the emission efficiency is reduced. Further, since the higher power consumption is required to obtain the sufficient emission efficiency, the lifetime of the light emitting diode is shortened. In a top emission type OLED display device, although increase in the area of the first and second capacitor electrodes 110 and 120 does not directly affect the area of the emitting area EA, there is a limit to obtain high resolution.

SUMMARY OF THE INVENTION

Accordingly, the present invention is directed to an organic light emitting diode display device and a method of fabricating the same that substantially obviate one or more of the problems due to limitations and disadvantages of the related art.

An organic light emitting diode display device in accordance with various embodiments may include: a pixel region defined by a gate line and a data line and having an emitting area and a transparent area; at least one driving element disposed in the emitting area; a power line overlapping the emitting area and connected to the at least one driving element; a first capacitor electrode disposed in the emitting area and overlapping the power line, wherein the power line and the first capacitor electrode form a first storage capacitor; and a second capacitor electrode disposed in the emitting area and overlapping the first capacitor electrode, wherein the first capacitor electrode and the second capacitor electrode form a second storage capacitor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the preferred embodiments, examples of which are illustrated in the accompanying drawings.

Figure 1:
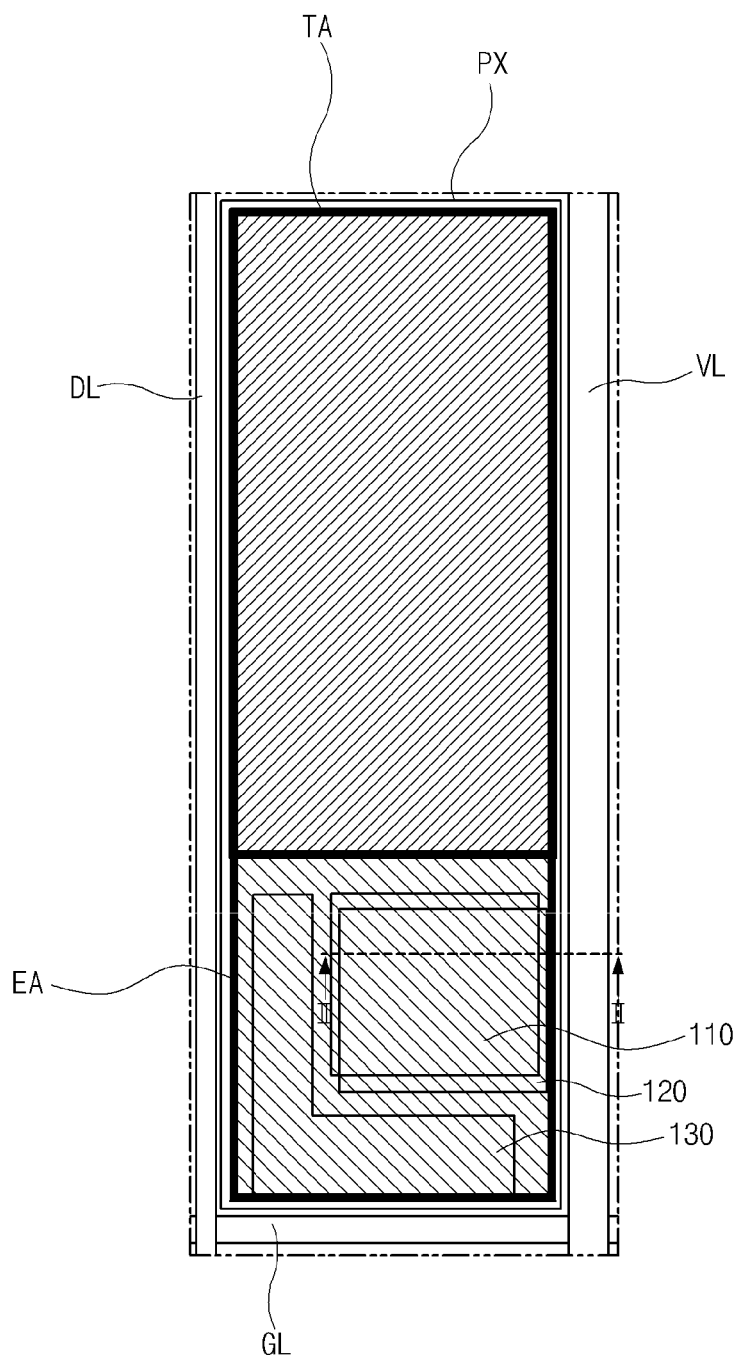
FIG. 1 is a plan view showing a transparent organic light emitting diode display device according to the related art.
Figure 2:
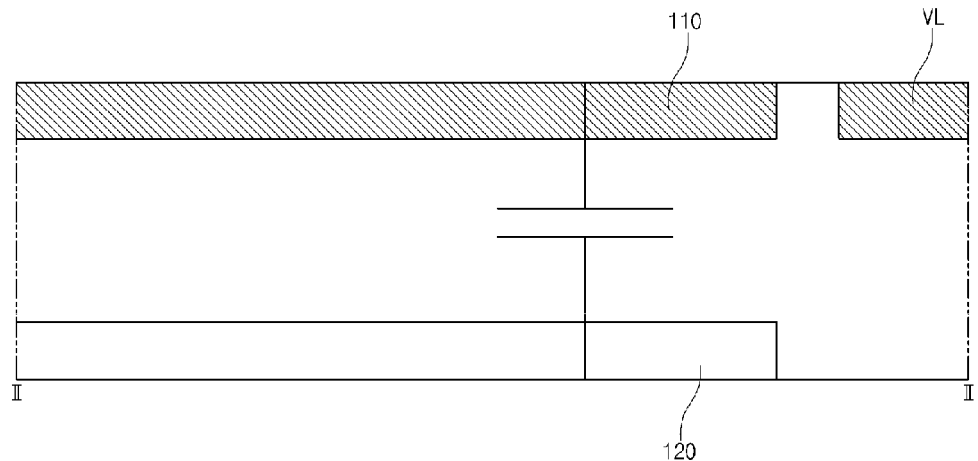
FIG. 2 is a cross-sectional view taken along a line II-II of FIG. 1.
Figure 3:
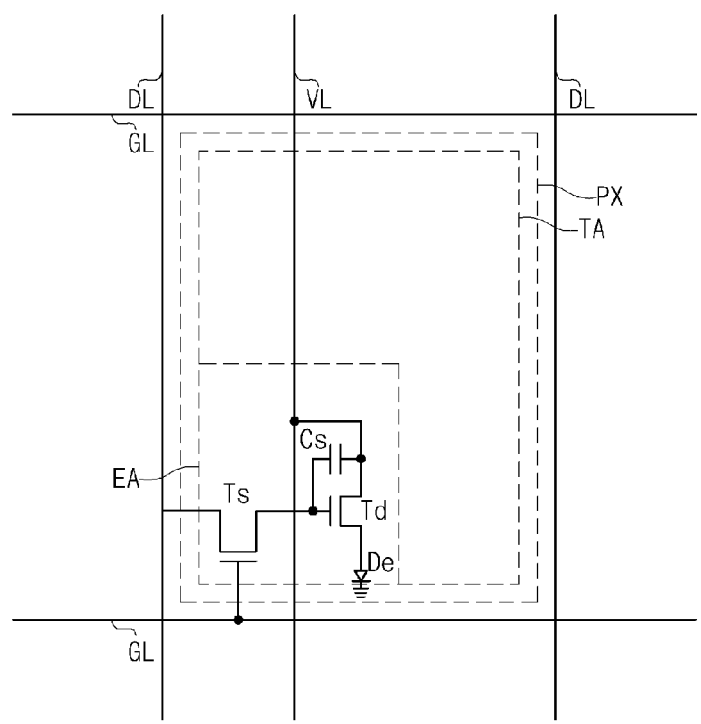
FIG. 3 is a view showing an organic light emitting diode display device according to various embodiments of the present invention.
Figure 4:
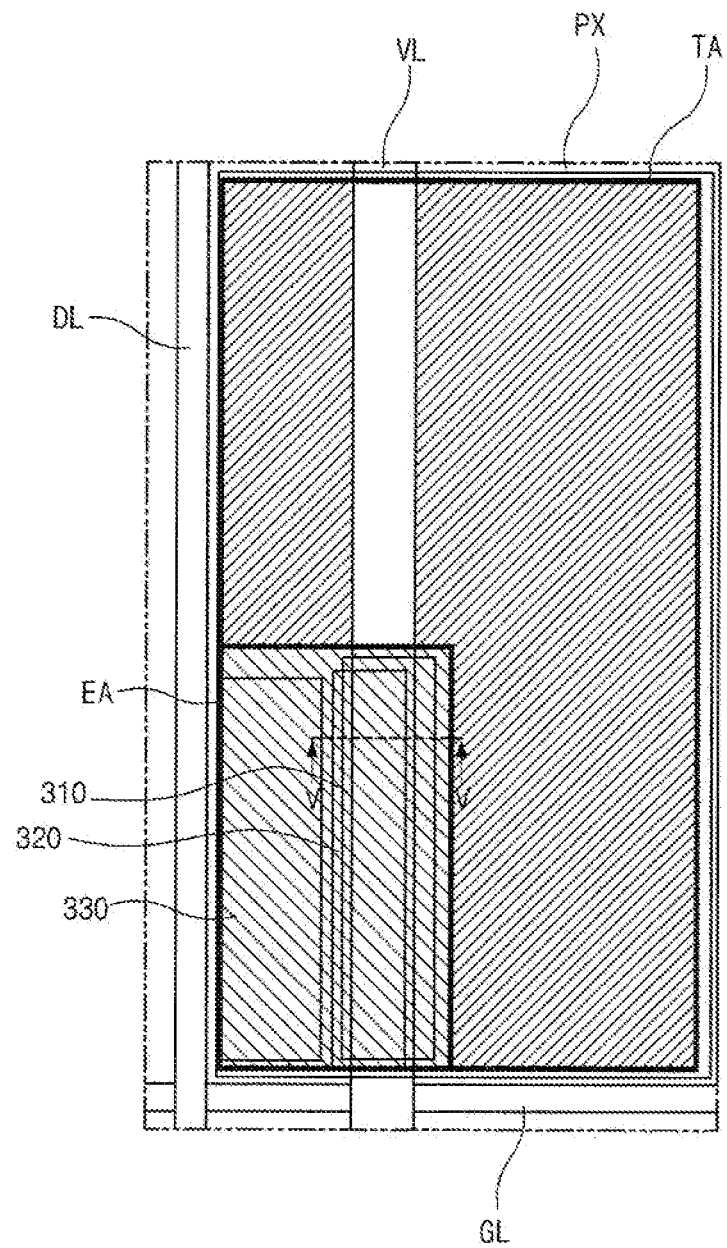
FIG. 4 is a plan view showing an organic light emitting diode display device according to various embodiments of the present invention.

FIG. 3 is a view showing an organic light emitting diode display device according to various embodiments of the present invention and FIG. 4 is a plan view showing an organic light emitting diode display device according to various embodiments of the present invention.

In FIGS. 3 and 4, an organic light emitting diode (OLED) display device according to various embodiments of the present invention includes a plurality of pixel regions PX each defined by a gate line GL and a data line DL. As an example, a pixel region PX may be defined by two neighboring gate lines GL and two neighboring data lines DL crossing the gate lines GL. Furthermore, a power line VL may in each case overlap a respective pixel region PX. In accordance with one or more embodiments, the term "overlap" as used herein in various places may be understood as an overlap of two elements when seen in a direction perpendicular or substantially perpendicular to a main processing surface of the display device. Each pixel region PX includes an emitting area EA and a transparent area TA. The transparent area TA may be transparent or substantially transparent for visible light. The transparent area TA may be a non-emitting area, in other words, an area which is not configured to emit light. The transparent area TA may be an area which is free from driving elements and an organic light emitting diode. In other words, the transparent area TA may be an area where driving elements and an organic light emitting diode are not formed. The emitting area EA may be an area configured to emit light. The emitting area EA may include an organic light emitting diode. The emitting area EA may be an area where one or more driving elements (e.g., thin film transistors) are formed. The presence of the driving elements in the emitting area EA may have the effect that the emitting area EA has a lower transmittance for visible light compared to the transparent area TA. For example, the emitting area EA may be substantially non-transparent for visible light. Although the emitting area EA is disposed at a side of the transparent area TA (e.g., at or close to the intersection of the data line DL and the gate line GL) in FIGS. 3 and 4, the emitting area EA and the transparent area TA may have various arrangements. For example, the emitting area EA may be surrounded by the transparent area TA in another embodiment.

Since the emitting area EA is connected to the gate line GL, the data line DL and the power line VL to receive a signal, the emitting area EA may be disposed at a region adjacent to the gate line GL and the data line DL for efficiency in driving, decrease of the emitting area EA and increase of the transparent area TA, in one or more embodiments.

The power line VL overlaps the emitting area EA and is connected to the emitting area EA to supply a source voltage. The emitting area EA may be configured as an area having a short side and a long side, wherein the short side is shorter than the long side. As an example, the emitting area EA may have a rectangular shape having a short side and a long side. As an example, the short side may be parallel to the gate line GL and the long side may be parallel to the data line DL. For example, a distance between the data line DL and the power line VL may be smaller than the short side of the emitting area EA. In addition, the power line VL overlaps a first capacitor electrode 310 of the emitting area EA to generate a first storage capacitor C1 (of FIG. 5). In one or more embodiments, the source voltage may be a power supply voltage. In one or more embodiments, the source voltage applied to the power line VL may be a voltage having a constant level. In one or more embodiments, the source voltage may be a voltage that is applied to a source terminal of a driving transistor. The source voltage applied to the power line VL may be a high level voltage Vdd and a data voltage may be applied to the first capacitor electrode 310 through the data line DL. As a result, the power line VL may function as a capacitor electrode and the first storage capacitor C1 is generated by the difference between the high level voltage of the power line VL and the data voltage of the first capacitor electrode 310. The first storage capacitor C1 may be generated by the difference between various voltages of the power line VL and the first capacitor electrode 310 according to design of the pixel region PX in another embodiment.

The power line VL is formed along a vertical direction parallel to the data line DL to have a vertically long shape. The term "vertical direction" may include or refer to a direction parallel to the data line DL. The term "vertically long shape" may include or refer to a shape that is elongated in a direction parallel to the data line DL, e.g. a rectangular shape having a long side and a short side, e.g. a strip, wherein the long side extends in a direction parallel to the data line DL. When the first capacitor electrode 310 has the same shape as or the similar shape to the power line VL, the overlapping area of the power line VL and the first capacitor electrode 310 increases. Accordingly, the first capacitor electrode 310 may be formed along the vertical direction to have a vertically long shape.

In addition, since the first capacitor electrode 310 has a vertically long shape, the emitting area EA may be formed along the vertical direction to have a vertically long shape for efficiency in decrease of the emitting area EA and increase of the transparent area TA.

Figure 5:
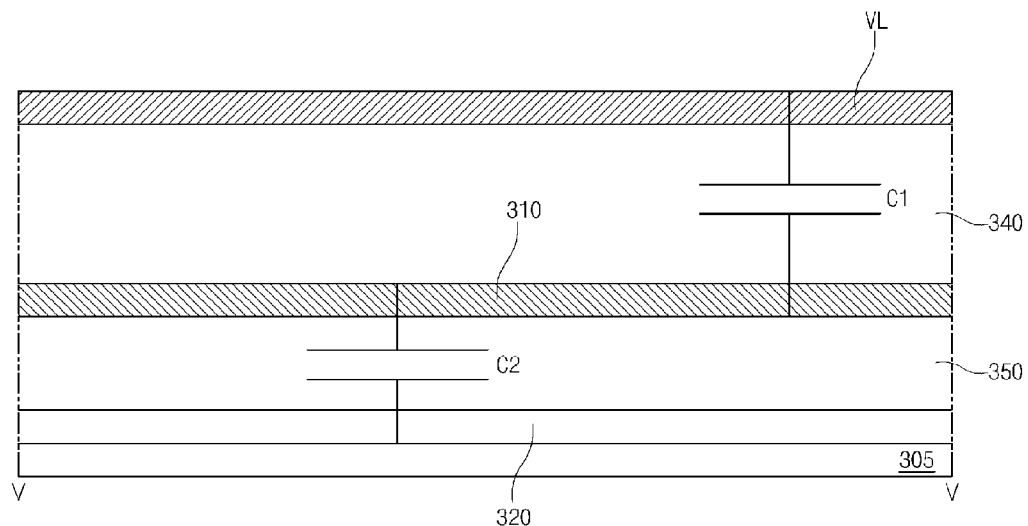
FIG. 5 is a cross-sectional view taken along a line V-V of FIG. 4.

A second capacitor electrode 320 is formed in the emitting area EA and overlaps the first capacitor electrode 310 to generate a second storage capacitor C2 (of FIG. 5). The second capacitor electrode 320 may be formed along the vertical direction to have a vertically long shape. In addition, the data voltage may be applied to the first capacitor electrode 310 through the data line DL, and the source voltage may be applied to the second capacitor electrode 320. For example, the source voltage may be a high level voltage Vdd. As a result, the second storage capacitor C2 is generated by the difference between the data voltage of the first capacitor electrode 310 and the high level voltage of the second capacitor electrode 320. The second storage capacitor C2 may be generated by the difference between various voltages of the first capacitor electrode 310 and the second capacitor electrode 320 according to design of the pixel region PX in another embodiment.

Driving elements 330 may drive a light emitting diode De and may be disposed at a region of the emitting area EA where the first and second capacitor electrodes 310 and 320 are not formed. Although the driving elements 330 may include the first and second capacitor electrodes 310 and 320, the driving elements 330 may be discriminated from the first and second capacitor electrodes 310 and 320 for illustration.

The driving elements 330 may include a plurality of thin film transistors (TFTs). For example, the driving elements 330 may include a switching TFT Ts connected to the gate line GL and the data line DL and a driving TFT Td connected to the switching TFT Ts and the power line VL. The light emitting diode De is connected to the driving TFT Td. When the switching TFT Ts is turned on, the data voltage is applied to the gate electrode of the driving TFT Td through the switching TFT Ts to turn on the driving TFT Td. The source voltage of the power line VL is applied to an electrode of the light emitting diode De through the driving TFT Td to drive the light emitting diode De. The source voltage may be the high level voltage Vdd and a low level voltage Vss may be applied to the other electrode of the light emitting diode De.

When the OLED display device has a top emission type, the light emitting diode De may be formed over the first and second capacitor electrodes 310 and 320 and the driving elements 330. Accordingly, the light emitting diode De may be disposed at most of the emitting area EA such that an area of the light emitting diode De is equal to or slightly smaller than the emitting area EA.

Although not shown, the light emitting diode De may include a first electrode connected to the drain electrode of the driving TFT Td, an emitting layer on the first electrode and a second electrode on the emitting layer.

When the second electrode is a cathode where the low level voltage Vss is applied, the second electrode may be formed of a metallic material having a relatively low work function. As a result, the second electrode has a relatively thin thickness to have a half-transparent property. Since the low level voltage Vss is applied to an end portion of the second electrode, an auxiliary electrode may be formed on the second electrode to prevent a voltage drop due to increase in resistance at a central portion of the large-sized OLED display device. The low level voltage may be applied to the auxiliary electrode and the auxiliary electrode may transmit the low level voltage to the second electrode to prevent the voltage drop. In addition, the auxiliary electrode may overlap one of the power line VL and the first and second capacitor electrodes 310 and 320 to constitute an auxiliary storage capacitor.

In the OLED display device, the plurality of TFTs may include a plurality of conductive layers such as a doped active layer, a gate layer and a source-drain layer. Since the first and second capacitor electrodes 310 and 320 are formed not to overlap the plurality of TFTs, the first capacitor electrode 310 may be formed of the same layer and the same material as one of the plurality of conductive layers and the second capacitor electrode 320 may be formed of the same layer and the same material as another one of the plurality of conductive layers.

Figure 6:
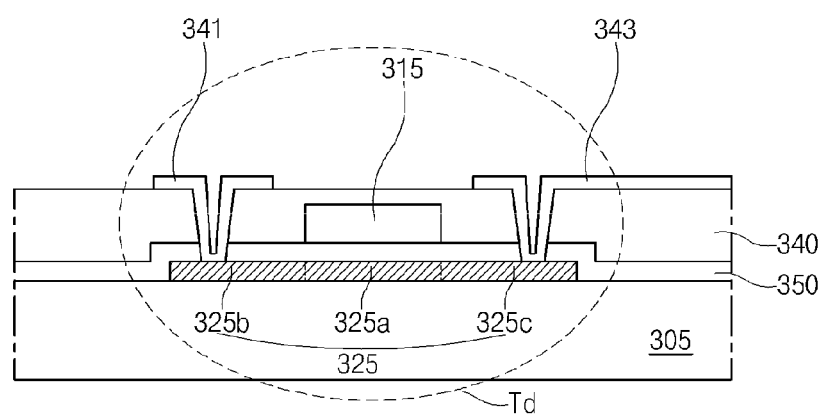
FIG. 6 is a cross-sectional view showing an example of a driving element of an organic light emitting diode display device according to various embodiments of the present invention.

FIG. 5 is a cross-sectional view taken along a line V-V of FIG. 4, and FIG. 6 is a cross-sectional view showing an example of a driving element of an OLED display device according to various embodiments of the present invention.

In FIG. 5, the second capacitor electrode 320 is formed on a substrate 305, and a first insulating layer 350 is formed on the second capacitor electrode 320. The first capacitor electrode 310 is formed on the first insulating layer 350 to overlap the second capacitor electrode 320. The first and second capacitor electrodes 310 and 320 and the first insulating layer 350 interposed therebetween constitute the second storage capacitor C2. In addition, a second insulating layer 340 is formed on the first capacitor electrode 310 and the power line VL is formed on the second insulating layer 340 to overlap the first capacitor electrode 310. The power line VL and the first capacitor electrode 310 and the second insulating layer 340 interposed therebetween constitute the first storage capacitor C1. Since the first and second storage capacitor C1 and C2 are connected to the driving elements such as the driving TFT Td in parallel, the capacitance increases without enlarging the first and second capacitor electrodes 310 and 320. Namely, the first and second storage capacitor C1 and C2 are connected in parallel to one another so that a total capacitance may be the sum of the capacitance of the first storage capacitor C1 and the capacitance of the second storage capacitor C2. The driving TFT Td may have various types.

In FIG. 6, the driving TFT Td having a co-planar type includes an active layer 325, a gate electrode 315, a source electrode 341 and a drain electrode 343. The active layer 325 is formed on the substrate 305 and has an active region 325*a* and source and drain regions 325*b* and 325*c* at both sides (e.g., opposite sides) of the active region 325*a*. The active region 325*a* may include an intrinsic polycrystalline silicon and the source and drain regions 325*b* and 325*c* may include an impurity-doped polycrystalline silicon. The first insulating layer 350 is formed on the active layer 325 and the gate electrode 315 is formed on the first insulating layer 350 over the active layer 325. The second insulating layer 340 is formed on the gate electrode 315 and the source and drain electrodes 341 and 343 are formed on the second insulating layer 340. The source and drain electrodes 341 and 343 are connected to the source and drain regions 325*b* and 325*c*, respectively. The drain electrode 343 may be the first electrode of the light emitting diode De.

When the driving TFT Td has a top gate co-planar type as shown in FIG. 6, the first capacitor electrode 310 may be formed of the same layer and the same material as the gate electrode 315 and the second capacitor electrode 320 may be formed of the same layer and the same material as the source and drain regions 325*b* and 325*c* of the active layer 325. In addition, the power line VL may be formed of the same layer and the same material as the source and drain electrodes 341 and 343.

Figure 7:
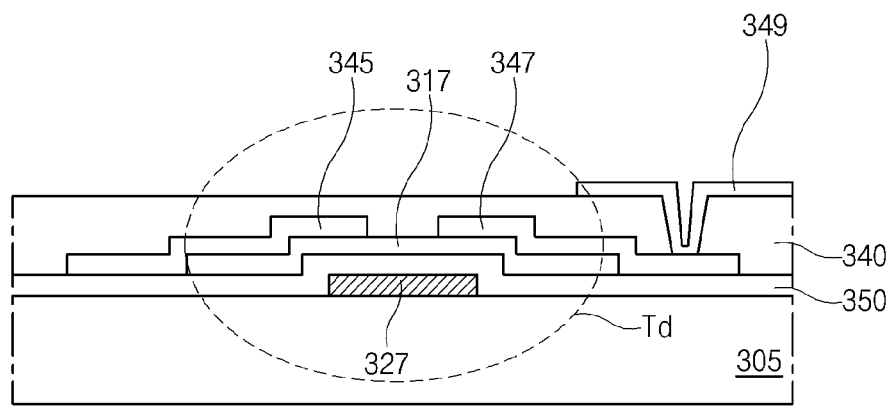
FIG. 7 is a cross-sectional view showing another example of a driving element of an organic light emitting diode display device according to various embodiments of the present invention.

FIG. 7 is a cross-sectional view showing another example of a driving element of an OLED device according to various embodiments of the present invention.

In FIG. 7, the driving TFT Td having an inverted staggered type includes a gate electrode 327, an active layer 317, a source electrode 345 and a drain electrode 347. The gate electrode 327 is formed on the substrate 305 and the first insulating layer 350 is formed on the gate electrode 327. The active layer 317 is formed on the first insulating layer 350 over the gate electrode 327. The active layer 317 may include an intrinsic amorphous silicon. The source and drain electrodes 345 and 347 are formed on the active layer 317. Although not shown, an ohmic contact layer including an impurity-doped amorphous silicon may be formed between the active layer 317 and the source electrode 345 and between the active layer 317 and the drain electrode 347. The second insulating layer 340 is formed on the source and drain electrodes 345 and 347. The first electrode 349 of the light emitting diode De may be formed on the second insulating layer 340 and may be connected to the drain electrode 347.

When the driving TFT Td has a bottom gate inverted staggered type as shown in FIG. 7, the first capacitor electrode 310 may be formed of the same layer and the same material as the source and drain electrodes 345 and 347 and the second capacitor electrode 320 may be formed of the same layer and the same material as the gate electrode 327. In addition, the power line VL may be formed of the same layer and the same material as the first electrode 349 of the light emitting diode De.

Even when the driving element may be of other types such as a double gate type, the first and second capacitor electrodes 310 and 320 and the power line VL may be formed of the same layer and the same material as the plurality of conductive layers, respectively, of the driving element.

In the OLED display device according to various embodiments, the total capacitance which is a sum of the capacitances of the first and second storage capacitors C1 and C2 increases. Since the power line VL which is an essential element for driving is used (in addition to the first and second capacitor electrodes) to generate the storage capacitor, the emitting area EA or the transparent area TA increases. As a result, emission efficiency or transmittance is improved. In addition, since the pixel region PX may be reduced without decrease of the emitting area EA, high resolution is obtained.

Figure 8:
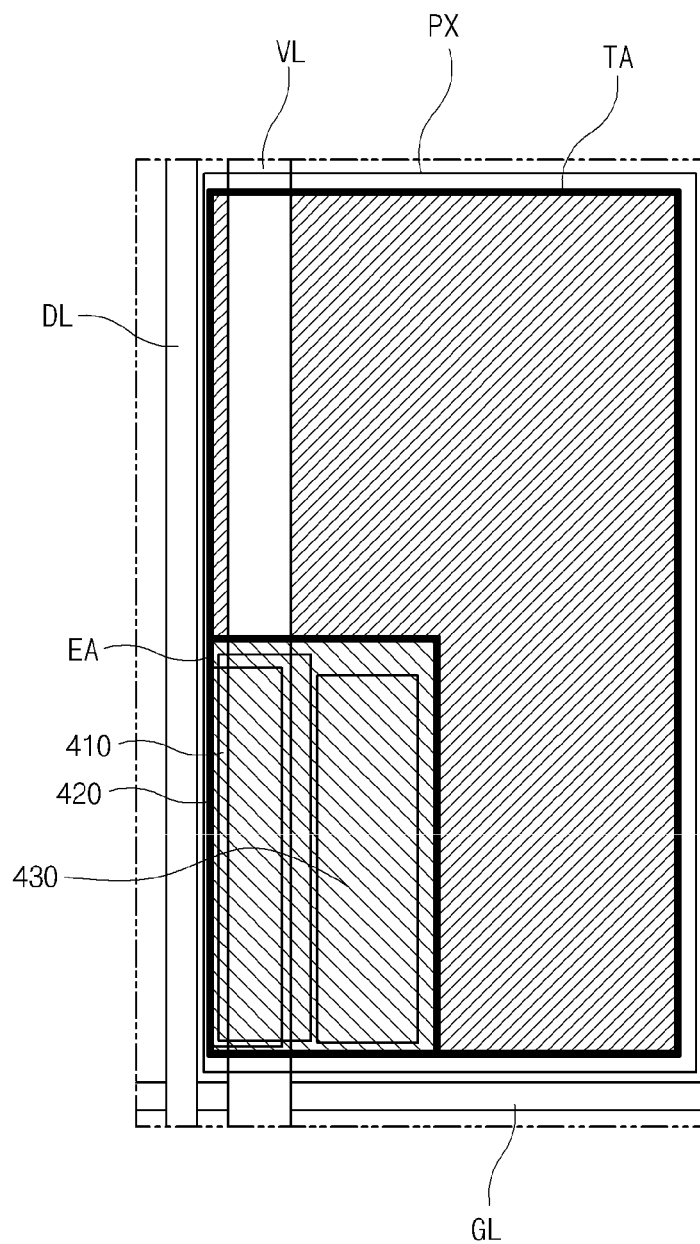
FIG. 8 is a plan view showing an organic light emitting diode display device according to various embodiments of the present invention.

FIG. 8 is a plan view showing an organic light emitting diode display device according to various embodiments of the present invention.

In FIG. 8, an organic light emitting diode (OLED) display device according to various embodiments of the present invention includes a plurality of pixel regions PX each defined by a gate line GL, a data line DL and a power line VL. Each pixel region PX includes an emitting area EA and a transparent area TA. The power line VL is disposed adjacent to the data line DL. For example, a distance between the data line DL and the power line VL may be smaller than a quarter of a short side of the emitting area EA. For example, the distance may be in the range from about 2 µm to about 5 µm in one or more embodiments.

The power line VL is formed along a vertical direction parallel to the data line DL to have a vertically long shape. In the OLED display device according to the related art, the power line VL may be disposed to correspond to one pixel region PX to supply the source voltage to the one pixel region PX or the power line VL may be disposed to correspond to adjacent two pixel regions PX to supply the source voltage to the two pixel regions PX. In the OLED display device shown in FIG. 8, according to various embodiments, since the emitting area EA is surrounded by the transparent area TA, the data line DL and the power line VL may be disposed along the vertical direction. Specifically, since the power line VL is disposed close to the data line DL in the transparent area TA, transmittance is improved as compared with the arrangement where the power line VL is disposed at a central portion of the transparent area TA. Since the data line DL and the power line VL which may reduce the transmittance are collectively formed (in other words, close to one another), transmittance is improved.

The data line DL and the power line VL are disposed spaced apart from each other to prevent interference of signals or electrical shortage. In addition, the power line VL may be disposed close to the data line DL in the transparent area TA and may have various arrangements according to design of the driving elements 330 in the emitting area EA. Transmittance is improved in the transparent area TA by disposing the data line DL and the power line VL collectively (close to one another), and the emitting area EA is enlarged by disposing a contact hole for connecting the light emitting diode and the driving TFT at an edge portion of the pixel region PX.

Consequently, in the OLED display device according to the present disclosure, since the total capacitance of the storage capacitor increases without enlargement of the capacitor electrodes by using the power line, the emitting area is enlarged. In the transparent OLED display device, specifically, the emitting area or the transparent area is enlarged. In addition, the pixel region is reduced without decrease of the emitting area, so that high resolution is obtained.

It will be apparent to those skilled in the art that various modifications and variations can be made in an organic light emitting diode display device and a method of fabricating the organic light emitting diode display device of the present disclosure without departing from the sprit or scope of the invention. Thus, it is intended that the present invention covers the modifications and variations of this invention provided they come within the scope of the appended claims and their equivalents.

What is claimed is:

1. An organic light emitting diode display device, comprising:
   a pixel region defined by a gate line and a data line and including an emitting area and a transparent area;
   at least one driving element disposed in the emitting area;
   a power line overlapping the emitting area and the transparent area and connected to the at least one driving element;
   a first capacitor electrode disposed in the emitting area and overlapping the power line, wherein the power line and the first capacitor electrode form a first storage capacitor, and wherein a width of a portion of the power line overlapping the first capacitor electrode is equal to a width of a portion of the power line overlapping, the transparent area; and
   a second capacitor electrode disposed in the emitting area and overlapping the first capacitor electrode, wherein the first capacitor electrode and the second capacitor electrode form a second storage capacitor.

2. The organic light emitting diode display device of claim 1, wherein the first storage capacitor and the second storage capacitor are connected to the at least one driving element in parallel.

3. The organic light emitting diode display device of claim 1, wherein the at least one driving element includes a plurality of conductive layers, and
   wherein the first capacitor electrode is formed of the same layer and a same material as a first layer of the plurality of conductive layers, and the second capacitor electrode is formed of the same layer and a same material, as a second layer of the plurality of conductive layers.

4. The organic light emitting diode display device of claim 1, wherein the emitting area is disposed at a side of the transparent area.

5. The organic light emitting diode display device of claim 1, wherein the transparent area surrounds the emitting area.

6. The organic light emitting diode display device of claim 1, wherein power line is formed to be parallel to the data line.

7. The organic light emitting diode display device of claim 1, wherein the emitting area is disposed at a region adjacent to the gate line and the data line.

8. The organic light emitting diode display device of claim 1, wherein the power line is disposed adjacent to the data line.

9. The organic light emitting diode display device of claim 8, wherein a distance between the data line and the power line is smaller than a short side of the emitting area.

10. The organic light emitting diode display device of claim 1, wherein the at least one driving element includes a driving thin film transistor.

11. The organic light emitting diode display device of claim 10, wherein the first capacitor electrode is formed of the same layer and the same material as a gate electrode of the driving thin film transistor, and the second capacitor electrode is formed of the same layer and the same material as source and drain regions of the driving thin film transistor.

12. The organic light emitting diode display device of claim 10, wherein the first capacitor electrode is formed of the same layer and the same material as source and drain electrodes of the driving thin film transistor, and the second capacitor electrode is formed of the same layer and the same material as a gate electrode of the driving thin film transistor.

13. The organic light emitting diode display device of claim 1, wherein the power line is formed of the same layer and the same material as source and drain electrodes of a driving thin film transistor.

14. The organic light emitting diode display device of claim 1, wherein the power line is formed of the same layer and the same material as an electrode of a light emitting diode disposed in the emitting area.

15. The organic light emitting diode display device of claim 1, further comprising:

a light emitting diode disposed in the emitting area and connected to the at least one driving element.

16. The organic light emitting diode display device of claim 15, wherein an area of the light emitting diode is equal to or smaller than the emitting area.

17. The organic light emitting diode display device of claim 15, further comprising:

a contact hole for connecting the light emitting diode and the at least one driving element, wherein the contact hole is disposed at an edge portion of the pixel region.

18. The organic light emitting diode display device of claim 1, wherein the power line is above both the first and second capacitor electrodes, and the first capacitor electrode is above the second capacitor electrode.

* * * * *